(12) United States Patent
Jeong

(10) Patent No.: US 7,906,432 B2
(45) Date of Patent: Mar. 15, 2011

(54) METHOD FOR MANUFACTURING SEMICONDUCTOR DEVICE

(75) Inventor: Kyung Ah Jeong, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 903 days.

(21) Appl. No.: 11/753,352

(22) Filed: May 24, 2007

(65) Prior Publication Data

US 2008/0102636 A1    May 1, 2008

(30) Foreign Application Priority Data

Oct. 31, 2006   (KR) .......................... 10-2006-0106688

(51) Int. Cl.
*H01L 21/311* (2006.01)

(52) U.S. Cl. ......... 438/694; 438/700; 438/706; 438/711; 438/719; 257/620; 257/758; 257/760; 257/774; 257/797

(58) Field of Classification Search .................. 438/694, 438/259, 309, 401, 445, 692, 700, 706, 711, 438/719, 732; 257/98, 620, 758, 760, 774, 797, 786, E23.179

See application file for complete search history.

(56) References Cited

U.S. PATENT DOCUMENTS

| 6,952,886 | B1 * | 10/2005 | Kim ............................... 33/645 |
| 2001/0029079 | A1 * | 10/2001 | Yokoyama .................... 438/309 |
| 2006/0211216 | A1 * | 9/2006 | Sandhu et al. ............... 438/445 |

FOREIGN PATENT DOCUMENTS

KR    1020000004414 A    1/2000

* cited by examiner

*Primary Examiner* — Nadine G Norton
*Assistant Examiner* — Maki A Angadi
(74) *Attorney, Agent, or Firm* — Kilpatrick Townsend & Stockton LLP

(57) ABSTRACT

A method of manufacturing a semiconductor device in which a source contact plug and a drain contact plug are formed. The method includes the steps of etching part of the semiconductor substrate to form a step, thus forming an overlay vernier, and forming a hard mask on the step so that the step is maintained.

5 Claims, 1 Drawing Sheet

METHOD FOR MANUFACTURING SEMICONDUCTOR DEVICE

CROSS-REFERENCES TO RELATED APPLICATIONS

The present application claims priority to Korean patent application number 10-2006-106688, filed on Oct. 31, 2006, which is incorporated by reference in its entirety.

BACKGROUND OF THE INVENTION

The present invention relates to semiconductor devices and, more particularly, to a method of manufacturing a semiconductor device, in which an overlay vernier is formed.

In general, when fabricating semiconductor devices, a patterning process for forming a pattern on a semiconductor substrate is performed. In order to perform the patterning process, a photoresist is formed on the semiconductor substrate and then an exposure process for photosensitizing the photoresist by irradiating light on a photomask photo or a reticle is performed.

A development process for removing the patterns of the photoresist that has been photosensitized by the exposure process is performed. After the development process, an overlay vernier formed through the above processes is measured by irradiating light.

The overlay vernier is formed in order to know and correct an alignment state between a layer formed in a previous process (when fabricating a semiconductor device of a stack structure) and a layer formed in a current process. The overlay vernier is formed on the semiconductor substrate along with a real pattern, preferably by forming a step.

In other words, a lower overlay vernier pattern is formed along with the formation of a lower layer pattern of a real cell, and an upper overlay vernier pattern is formed along with the formation of an upper layer pattern of the real cell. The degree in which the two layers overlap with each other is detected by using the lower overlay vernier pattern and the upper overlay vernier pattern.

Meanwhile, in order to perform the exposure process, an alignment process by reading an alignment key using irradiating light must be performed. Accordingly, the alignment process can be performed only when a step, which becomes a visible marker for reading using light, is formed or an upper hard mask is made from transparent material. Furthermore, the measurement of the overlay vernier, which is performed after the development process, also can only be performed when a step is formed or an upper hard mask is made from transparent material.

As the size of a semiconductor device is gradually miniaturized and the level of integration of a semiconductor device is gradually increased, however, a technique for forming a micro pattern has been developed. In the past, the hard mask was formed from oxide, etc. through which light can pass. However, recently, the hard mask has been formed from amorphous carbon.

Amorphous carbon is an opaque material through which light cannot pass. Thus, in order to perform an alignment process performed at the time of the exposure process and an overlay vernier read process performed after the development process, an additional process for forming a step must be carried out.

Therefore, after a drain key open mask process and a drain key open etch process are performed after the deposition of an insulating layer, an amorphous carbon hard mask or the like, must be formed on the upper side. However, it increases the process steps compared to using the transparent hard mask. Consequently, there are problems in that an overall process time is lengthened and the cost of production is increased.

SUMMARY OF THE INVENTION

The present invention relates to a technique capable of forming an overlay vernier without performing additional drain key open mask and drain key open etch processes in such a manner that a step is formed in a semiconductor substrate when the overlay vernier is formed, and a hard mask having a stack layer formed thereon is formed so that the shape of the step can be maintained.

According to an aspect of the present invention, there is provided a method of manufacturing a semiconductor device in which a source contact plug and a drain contact plug are formed, including the steps of etching part of the semiconductor substrate to form a step, thus forming an overlay vernier, forming a hard mask on the step so that the step is maintained.

DESCRIPTION OF SPECIFIC EMBODIMENTS

A specific embodiment according to the present patent will be described with reference to the accompanying drawings.

Figure 1A:
FIGS. 1A to 1E are cross-sectional views illustrating a method of manufacturing a semiconductor device according to an embodiment of the present invention.

Referring to FIG. 1A, there is provided a semiconductor substrate 100 including a real cell (not illustrated) in which specific patterns, such as an isolation layer (not illustrated) and a gate (not illustrated), are formed, and a scribe line in which an overlay vernier is formed. In the real cell and the scribe line, processes to be described later are performed at the same time.

An etch-stop layer 102 is formed on the semiconductor substrate 100. The etch-stop layer 102 can include a Self-Aligned Contact (SAC) nitride layer. Further, in order to form a source contact hole in the real cell, an etch process employing a source contact mask (not illustrated) is carried out. In this case, the etch process is also performed in the scribe line. Thus, some of the etch-stop layer 102 and the semiconductor substrate 100 are removed, and a step is formed between a region from which the etch-stop layer 102 and the semiconductor substrate 100 have been removed and a region from which the etch-stop layer 102 and the semiconductor substrate 100 have not been removed.

In this case, the region from which the etch-stop layer 102 and the semiconductor substrate 100 have been removed has a relatively wide width and a relatively large pattern, compared with the cell contact. Therefore, the region can be further etched by means of a loading phenomenon compared with the cell contact. It is therefore possible to form a sufficiently deep step.

Meanwhile, the height of the region from which the etch-stop layer 102 and the semiconductor substrate 100 have been removed can be about 0.7 μm, but is not limited thereto. It is evident that the height and shape of the region from which the etch-stop layer 102 and the semiconductor substrate 100 have been removed can be freely changed to the extent that the step can be formed effectively.

Figure 1B:
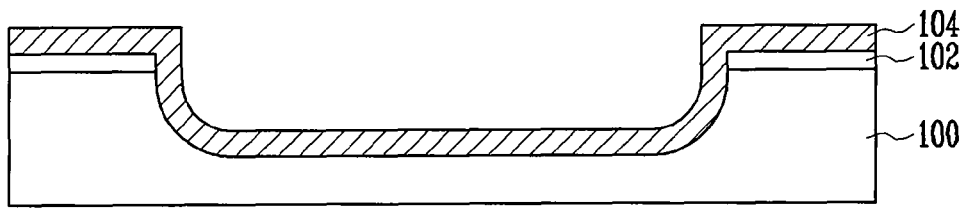

Referring to FIG. 1B, in order to fill the source contact hole in the real cell, a conductive layer 104 is formed on the entire surface including the etch-stop layer 102 and the semiconductor substrate 100. The conductive layer 104 is formed to a thickness in which the region from which the etch-stop layer 102 and the semiconductor substrate 100 have been removed in the above process can have a step shape without being fully filled. The conductive layer 104 can be formed from material, which is conductive and can be made thin, e.g., tungsten (W).

Figure 1C:
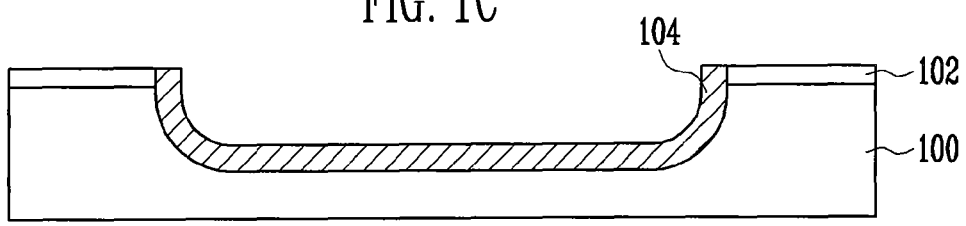

Referring to FIG. 1C, in order to form a source contact plug in the real cell, a Chemical Mechanical Polishing (CMP) process is performed on the conductive layer 104. In this case, since a sufficiently deep step is formed due to the loading phenomenon and the CMP process is stopped in the etch-stop layer 102, the step formed due to the removed region can be kept intact. The step can be used as an overlay vernier, which is a reference when forming the source contact plug.

Figure 1D:
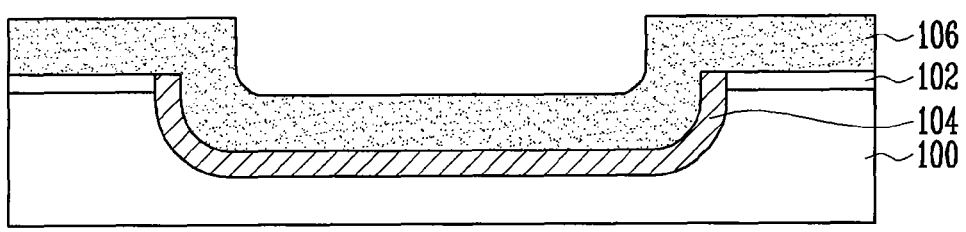

Referring to FIG. 1D, in order to form an insulating layer in the real cell, an insulating layer 106 is formed on the entire surface including the etch-stop layer 102 and the conductive layer 104. The insulating layer 106 is formed so that the shape of the step is maintained.

Figure 1E:
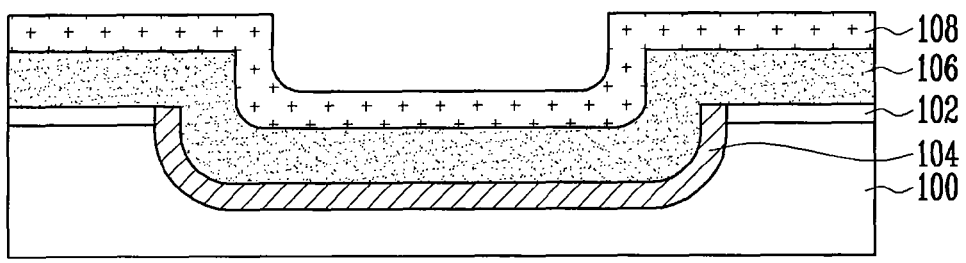

Referring to FIG. 1E, in order to form a drain contact plug in the real cell, a hard mask 108 is formed on the insulating layer 106. The hard mask 108 can be formed from an amorphous carbon layer. The amorphous carbon layer has a good flow physical property, and therefore can be formed to maintain the shape of the step.

When fabricating a semiconductor device of a stack structure in a subsequent process, the step can be used to know and correct an alignment state between a layer formed in a previous process and a layer formed in a current process. It is therefore possible to form an overlay vernier, which becomes a reference when forming the drain contact plug. Accordingly, a drain key open mask process and a drain key open etch process, which are additionally performed in order to form a step in the prior art due to an opaque amorphous carbon layer, can be omitted.

According to the present invention, when a source contact is formed, some regions of a semiconductor substrate in a scribe line are etched to form a step, forming an overlay vernier for forming a source contact plug. A stack layer is formed on an upper side so that the shape of the step can be maintained, forming a hard mask. It is therefore possible to form an overlay vernier for forming a drain contact plug without performing additional drain key open mask and drain key open etch processes. Therefore, even when a hard mask is an opaque layer, it is not necessary to perform an additional overlay vernier formation process. Accordingly, there are advantages in that the process can be simplified, process time can be shortened, manufacturing cost can be saved, and the reliability of a device can be improved.

Although the foregoing description has been made with reference to the various embodiments, it is to be understood that changes and modifications of the present patent may be made by the ordinary skilled in the art without departing from the spirit and scope of the present patent and appended claims.

What is claimed is:

1. A method of manufacturing a semiconductor device, including a semiconductor substrate, which includes a real cell region and a scribe line region, the method comprising:
    etching parts of the semiconductor substrate to form a step in the semiconductor substrate of the scribe line region and to form a source contact hole in the real cell region;
    forming a conductive layer on the entire surface including the semiconductor substrate so that the shape of the step in the scribe line region is maintained and the source contact hole in the real cell region is filled;
    performing a chemical mechanical polishing process to form a source contact plug in the real cell region;
    forming an insulating layer on the entire surface including the conductive layer so that the shape of the step in the scribe line region is maintained; and
    forming a hard mask on the insulating layer to form a drain contact plug in the real cell region so that the shape of the step in the scribe line region is maintained,
    wherein the step in the scribe line region is used as an overlay vernier when the drain contact plug is formed.

2. The method of claim 1, wherein the hard mask is formed from an opaque material through which light cannot pass.

3. The method of claim 2, wherein the hard mask includes an amorphous carbon layer.

4. The method of claim 1, wherein the step in the scribe line region is used as an overlay vernier when the source contact plug is formed.

5. The method of claim 1, further comprising forming an etch-stop layer on the semiconductor substrate including the real cell region and the scribe line region, before etching parts of the semiconductor substrate.

* * * * *